United States Patent [19]

Hirata et al.

[11] Patent Number: 4,807,245
[45] Date of Patent: Feb. 21, 1989

[54] DISTRIBUTED-FEEDBACK TYPE SEMICONDUCTOR LASER

[75] Inventors: Shoji Hirata; Kazuo Honda, both of Kanagawa, Japan

[73] Assignee: Sony Corp., Tokyo, Japan

[21] Appl. No.: 70,215

[22] Filed: Jul. 6, 1987

[30] Foreign Application Priority Data

Jul. 28, 1986 [JP] Japan .................................. 61-177372

[51] Int. Cl.[4] .............................................. H01S 3/08
[52] U.S. Cl. ......................................... 372/96; 372/46
[58] Field of Search ............................... 372/43, 46, 96

[56] References Cited

U.S. PATENT DOCUMENTS 4,624,000 11/1986 Streifer et al. ........................ 372/45

FOREIGN PATENT DOCUMENTS 0191093 8/1986 Japan ..................................... 372/43

OTHER PUBLICATIONS

J. N. Walpole et al; "Distributed Feedback $Pb_{1-x}Sn_xTe$ Double Heterostructure Lasers"; Appl. Phys. Letters, vol. 29, No. 5, Sep. 1, 1976; pp. 307-309.
Patent Abstracts of Japan, vol. 7, No. 258 (E-211)[1403], Nov. 17, 1983; & JP-A-58 143 595 (Sanyo Denki K.K.) 08-26-1983.
Patent Abstracts of Japan, vol. 8, No. 194 (E-264)[1631], Sep. 6, 1984; & JP-A-59 80 984 (Hitachi Seisakusho K.K.) 05-10-1984.
Patent Abstracts of Japan, vol. 9, No. 159 (E-326)[1882], Jul. 4, 1985; and JP-A-60 37 793 (Nippon Denki K.K.) 02-27-1985.
Toute L'Electronique, No. 514, May 1986, pp. 5, 6, 8, Paris, FR; "Panorama Technique: Composants opto--electroniques pour modulation multigigahertz".
IEEE Journal of Quantum Electronics, vol. QE-22, No. 7, Jul. 1986, pp. 1042-1051, IEEE, N.Y., K. Utaka et al., "Lamda/4-Shifted InGaAsP/InP DFB Laswers".

Primary Examiner—William L. Sikes
Assistant Examiner—B. Randolph
Attorney, Agent, or Firm—Alvin Sinderbrand

[57] ABSTRACT

A distributed-feedback type semiconductor laser device having an active layer arranged between a pair of clad layers is provided with a stripe-shaped distributed-feedback mechanism, for example, having the configuration of a diffraction grating, and dummy regions of the same configuration as the distributed feedback mechanism arranged at opposite sides of the latter and being spaced from the distributor-feedback mechanism by relatively narrow plane regions, with the result that the distributed-feedback mechanism can be formed as a narrow stripe with good reproducibility so that it is possible to provide the semiconductor laser device with a long useful life and with the capability of operating in single longitudinal and transverse modes.

10 Claims, 4 Drawing Sheets

DISTRIBUTED-FEEDBACK TYPE SEMICONDUCTOR LASER

BACKGROUND OF THE INVENTION

1. Field of the Invention

This invention relates to a distributed-feedback type semiconductor laser device and a method of producing the same.

2. Description of the Prior Art

In conventional distributed-feedback type semiconductor laser devices, a diffraction grating is formed all over the surface of a guide layer disposed adjacent an active region of the laser device which includes an active layer to provide for single longitudinal mode (SLM) operation. On the other hand, single transverse mode operation by a refractive index wave guide is achieved by the use of a structure formed externally at a position apart from the diffraction grating after all crystal growth is completed.

The foregoing known structure requires additional crystal growth and other manufacturing steps which give rise to problems that need to be solved. For example, a buried heterostructure (BH) type distributed-feedback semiconductor laser requires that crystal growth be effected three times. During the third crystal growth period, a crystal is grown in an inverted mesa form, which results in problems involving the boundary at which a leak current can occur if the boundary is badly formed, the current path, controllability of the p-n junction produced by diffusion of dopants when heat treatment is effected for a long time, and so on. On the other hand, in a ridge structure-type distributed-feedback semiconductor laser device, the refractive index wave guide characteristic depends largely on the thickness of an active region arranged at opposite sides of a ridge structure and on the ridge width. Therefore, the production of the ridge structure must be precisely controlled.

It has been proposed in Japanese Laid-open Patented Publication No. 59-80984 to provide a surface illuminant distributed-feedback type semiconductor laser device in which a periodic uneven surface, that is, a diffraction grating, is formed on the surface of a light guiding layer. Then, such surface of the light guiding layer other than a striped-shaped region extending in the forwarding direction of the laser light, is etched to a depth short of the underlying active layer with the object of obtaining plane regions at the etched surface portion, whereupon, a clad layer is grown on the light guiding layer. However, since the desired plane regions are obtained by etching surface portions on which the diffraction grating had been earlier formed, wave-shaped wrinkles inevitably remain in the nominally plane regions. The clad layer cannot be satisfactorily grown on the wrinkled plane regions of the guiding layer, and this adversely influences the useful life of the laser device and the stability of its operations.

Persons having an obligation to assign their inventions to the assignee of the present application have proposed, in Japanese Patent Application No. 61-141137, a distributed-feedback type semiconductor laser device in which an active layer is interposed between a pair of clad layers and a stripe-shaped distributed feedback means constituted by a diffraction grating is formed in a guide layer on the active layer, while surface portions of the guide layer at opposite sides of the stripe-shape diffraction grating are maintained substantially planar, that is, wrinkle free. Since the guide layer surface portions at opposite sides of the stripe-shaped diffraction grating are planar, each crystal layer grown successively on the guide layer after the diffraction grating is formed can be provided with good crystallinity for prolonging the useful life of the semiconductor laser device and improving the stability of its operations. However, if the diffraction grating is formed only on a narrow region of the guide layer, as in the foregoing proposal, it is difficult to control the manufacturing conditions so as to ensure the uniform formation of the diffraction grating with good reproducibility.

OBJECTS AND SUMMARY OF THE INVENTION

Accordingly, it is a object of the present invention to provide a distributed-feedback type semiconductor laser device which can be operated in single longitudinal and transverse modes, and which avoids the above-described problems associated with the prior art.

More specifically, it is an object of this invention to provide a distributed-feedback type semiconductor laser device which can be operated in the single longitudinal and transverse modes, and which can be economically manufactured with good reproducibility.

In accordance with an aspect of this invention, a distributed-feedback type semiconductor laser device comprises a pair of clad layers, an active layer interposed between the clad layers, stripe-shaped distributed-feedback means formed on the active layer, for example, in a guide layer on the active layer, relatively narrow plane regions extending along opposite sides of the distributed-feedback means, and inactive regions at opposite sides of the distributed-feedback means and having the same configuration as the latter with the plane regions dividing the inactive regions from the distributed-feedback means.

In accordance with another aspect of the invention, a method of producing a distributed-feedback type semiconductor laser device comprises sequentially epitaxially growing, on a substrate, a clad layer, an active layer and a guide layer, coating a photo-resist layer on the guide layer, effecting a first exposure of the photo-resist layer through a photo-mask along a pair of relatively narrow, stripe-like, spaced apart areas, effecting holographic exposure of the photo-resist layer at the areas thereof other than the stripe-like areas that were first exposed so as to provide a latent image of a diffraction grating on such other areas, developing the exposed photo-resist layer so as to form a resist mask therefrom, selectively etching the guide layer through the resist mask so that the guide layer forms a stripe-shaped distributed-feedback means on the active layer, relatively narrow plane regions extending along opposite sides of the distributed-feedback means and inactive regions at opposite sides of the distributed-feedback means and having the same configuration as the latter with the plane regions dividing the inactive regions from the distributed-feedback means, and epitaxially growing a clad layer on the etched guide layer.

The above, and other objects, features and advantages of the present invention, will be apparent in the following detailed description of a preferred embodiment which is to be read in conjunction with the accompanying drawings forming a part hereof and in which corresponding parts and elements are identified by the same reference numerals in the several views.

DESCRIPTION OF THE PREFERRED EMBODIMENT

Figure 2:
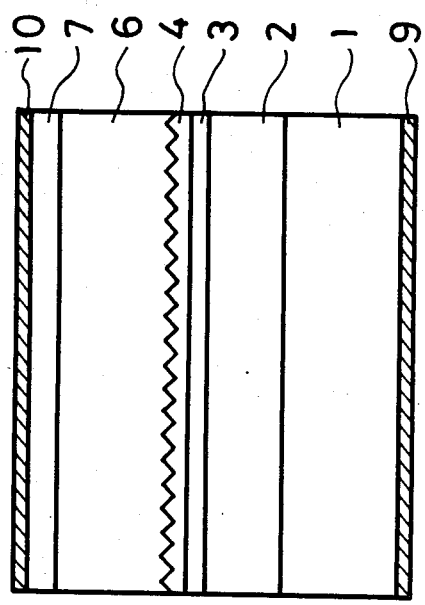
FIG. 2 is a sectional view taken along the line II—II on FIG. 1.

In order that the problems solved by the present invention may be fully understood, a previously proposed distributed-feedback type semiconductor laser device as disclosed in Japanese Patent Application No. 61-141-137 will now be described with reference to FIGS. 1, 2 and 3. Such semiconductor laser device is shown to include a p-type 1 of GaAs on which there are formed, in succession, a p-type clad layer 2 of AlGaAs, an active layer 3 of GaAs, an n-type guide layer 4 of AlGaAs, an n-type clad layer 6 of AlGaAs and an n-type cap layer 7 of GaAs. Alternatively, the substrate 1 may be n-type, in which case clad layer 2 is n-type and guide layer 4, clad layer 6 and cap layer 7 are each p-type. A stripe-shaped distributed-feedback means constituted by a diffraction grating 5 is formed centrally on guide layer 4, while surface portions 4a of guide layer 4 at opposite sides of the stripe-shaped diffraction grating 5 are maintained in a planar form. Ion implanted regions 8 extend through the opposite side regions of cap layer 7 into clad layer 6, and result from the implanting therein of ions, such as, proton, or boron. Ohmic electrodes 9 and 10 are provided on substrate 1 and cap layer 7, respectively.

Figure 1:
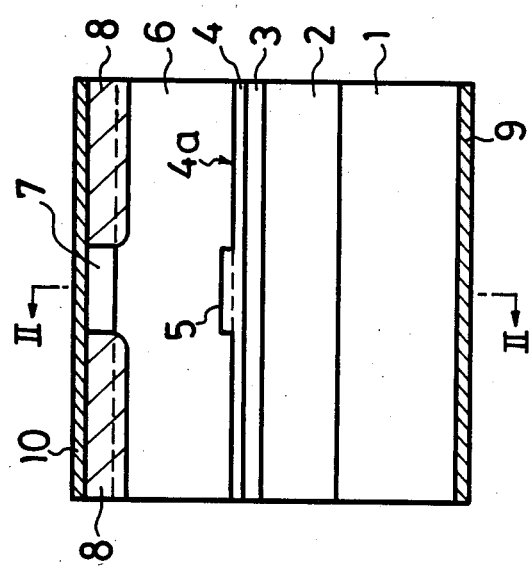
FIG. 1 is a cross-sectional view of a distributed-feedback type semiconductor laser device according to the prior art.
Figure 3:
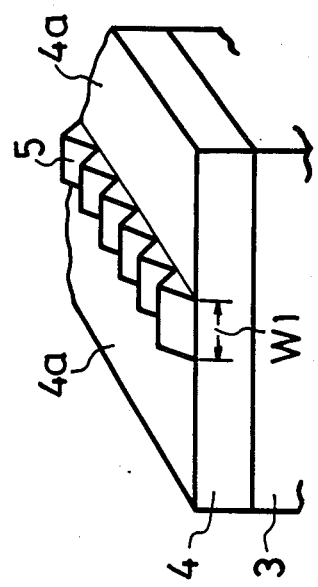
FIG. 3 is a fragmentary perspective view showing a portion of the distributed-feedback type semiconductor laser device of FIGS. 1 and 2.

As earlier mentioned, and as shown in FIGS. 1-3, the stripe-shaped diffraction grating 5 extends in the forwarding direction of the laser light so that the distributed-feedback type semiconductor laser device is operated in the single longitudinal mode and the transverse mode. Since the guide layer surfaces 4a at the opposite sides of the stripe-shaped diffraction grating 5 are planar, each crystal layer grown thereon, for example, the clad layer 6, after the formation of the diffraction grating 5 can be formed with good crystallinity to thereby prolong the useful life of the semiconductor laser device and to improve its stability of operation.

The diffraction grating 5 has a pitch in the range from 0.1 to 0.2 $\mu$m and is desirably formed on guide layer 4 by the use of a holographic exposure method employing the interference of two ultraviolet laser light sources. However, in order to form a uniform and noise-free diffraction grating of substantial size, it is necessary to precisely control the manufacturing conditions, such as, exposure, development, etching and the like.

However, in the previously proposed distributed-feedback type semiconuuctor laser device shown in FIGS. 1–3, the diffraction grating 5 is formed only on a narrow area having a Width $W_1$ which ranges from 2.0 to 5.0 $\mu$m. In such case, it is difficult to effect the requisite precise control of the manufacturing conditions, with the result that it is extremely difficult to uniformly form the diffraction grating 5 with the degree of reproducibility necessary for obtaining an acceptable yield.

Figure 4:
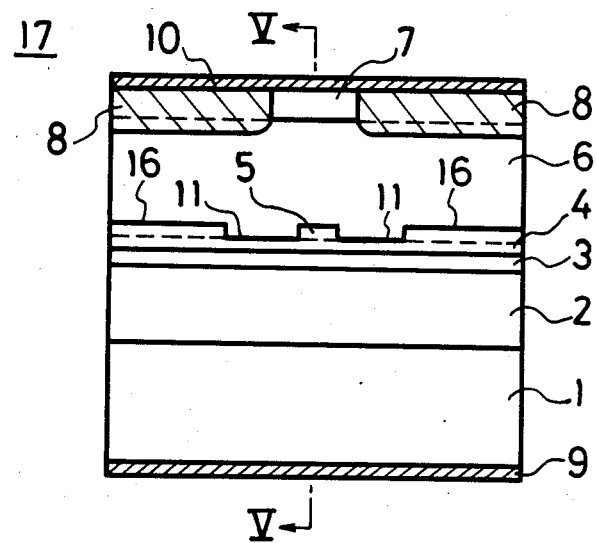
FIG. 4 is a cross-sectional view similar to that of FIG. 1, but showing a distributed-feedback type semiconductor laser device according to an embodiment of the present invention.
Figure 5:
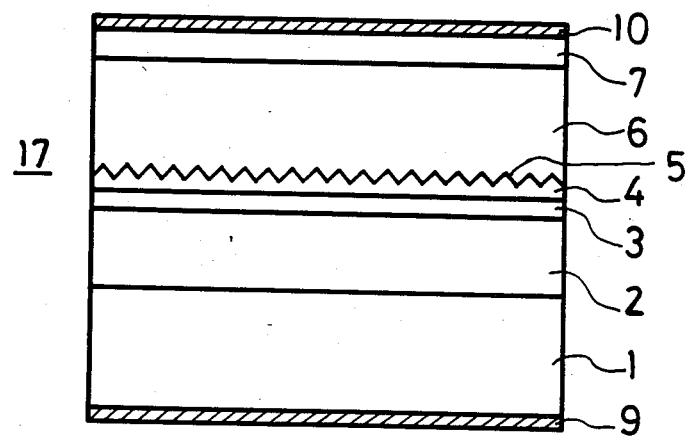
FIG. 5 is a sectional view taken along the line V—V on FIG. 4.
Figure 7A:
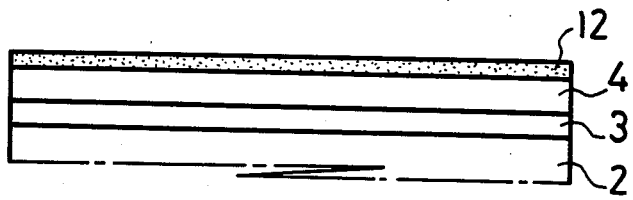
FIGS. 7A–7E are schematic sectional views illustrating successive steps in the manufacturer of a distributed-feedback type semiconductor laser device in accordance with the present invention.
Figure 7B:
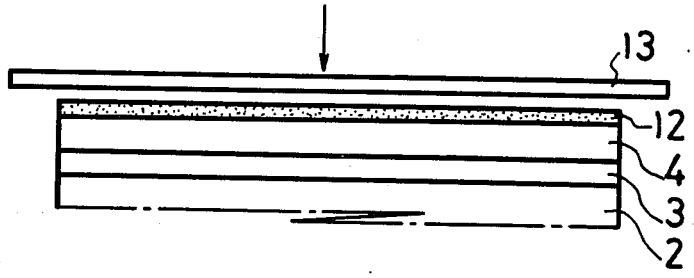

Referring now FIGS. 4 & 5, it will be seen that, in a distributed-feedback type semiconductor laser device according to an embodiment of the present invention, a clad layer 2 of p-type $AlGaA_s$, an active layer 3 of GaAs and a guide layer 4 of n-type AlGaAs, are sequentially epitaxially grown on a substrate 1 of p-type GaAs. Then, as shown on FIG. 7A, a positive type photo-resist layer 12 is coated on guide layer 4, and a first exposure of the photo-resist layer 12 is effected through a photo-mask 13, as illustrated on FIG. 7B. As shown on FIG. 8, the photo-mask 13 has relatively narrow, stripe-like, parallely spaced apart transparent areas 13a while the remainder of photo-mask 13 is of a light shielding or opaque material, as is indicated at 13b. In the case where two semiconductor laser devices are being simultaneously produced, the photo-mask 13 is dimensioned to correspond to two semiconductor laser devices arrayed side-by-side, and two pairs of the transparent stripe-like areas 13a are laterally centered in the portions of photo-mask 13 at opposite sides of the longitudinal median line A—A thereof. It will be appreciated that during the first exposure illustrated on FIG. 7B, photo-resist layer 12 is exposed only along the narrow transparent areas 13a of the photo-mask.

Figure 7C:
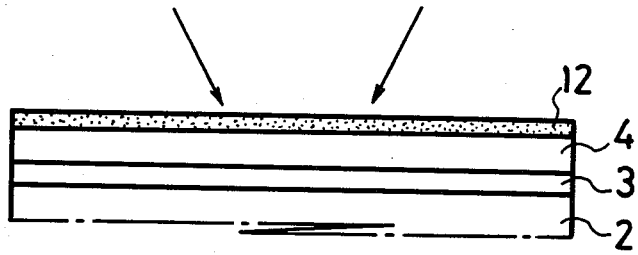

Thereafter, as illustrated on FIG. 7C, the photo-resist layer 12 is subjected to holographic exposure, for example, by means of a 2-beam interference method employing a 351.1 nm line of an Ar+ laser light source, so as to provide a latent image of a diffraction grating on portions of the photo-resist layer 12. Since those portions of the photo-resist layer corresponding to the transparent stripe-shaped areas 13a of photo mask 13 have already been exposed in the course of the first exposure, the interference fringe is not formed on such portions of the photo-resist layer. In other words, the latent image of a diffraction grating is only formed on those portions of the photo-resist layer 12 which correspond to the opaque portions 13b of photo-mask 13. At this time, it should be noted that the order of the first exposure illustrated in FIG. 7B and the second or holographic exposure illustrated in FIG. 7C may be reversed or interchanged.

Figure 7D:
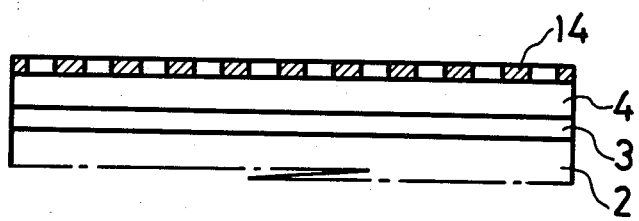

The exposed photo-resist layer is suitably developed to form a resist-mask 14, as shown on FIG. 7D. The conditions employed for such development of the exposed photo-resist layer may be substantially the same as those conventionally used in the prior art when a diffraction grating is formed all over the entire surface of the guide layer.

Figure 6:
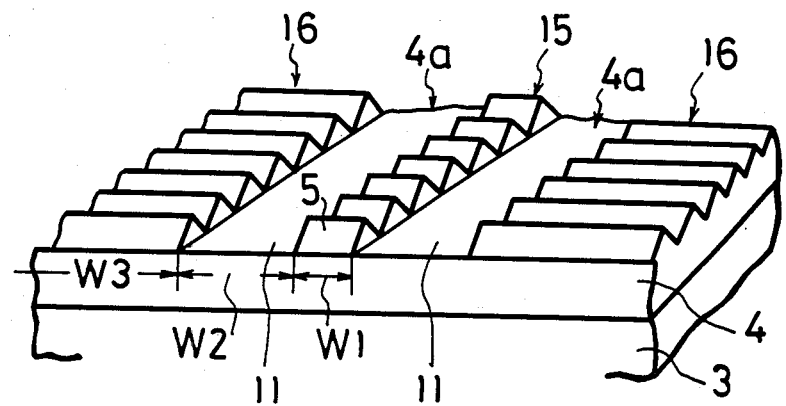
FIG. 6 is a fragmentary perspective view showing a portion of the distributed-feedback type semiconductor laser device of FIGS. 4 and 5.
Figure 7E:
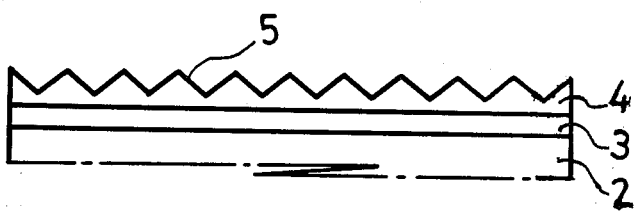

Then, as illustrated on FIG. 7E, the guide layer 4 is selectively etched by an appropriate etching liquid acting through the developed resist-mask 14. The conditions for such etching may also be the same as those employed in forming a diffraction grating over the entire surface of the guide layer in a semiconductor laser device according to the prior art. By virtue of the selective etching, an elongated, raised rib-like structure 15 is formed with a narrow striped shape and, simultaneously, the surface of the rib structure 15 is formed with a periodic uneven or saw-tooth pattern or configuration that defines the diffraction grating 5 extending in the forwarding direction of the laser light. At the opposite sides of the raised rib structure 15, elongated plane surfaces 4a corresponding to the elongated transparent areas 13a of the photo-mask 13 are etched away to a depth corresponding to the valleys of the saw-tooth pattern forming diffraction grating 5 and form the relatively narrow plane regions 11. Further, the selective etching forms inactive regions 16 (FIGS. 4 & 6) at opposite sides of the diffraction grating 15 and having the same configuration or saw-tooth pattern as the latter, with such inactive regions 16 being divided from the diffraction grating 15 by the plane regions 11 and constituting a major portion of the surface of the etched guide layer 4. As is clearly shown on FIG. 6, the maximum depth to which the guide layer 4 is etched, and which corresponds to the plane regions 11 and the valleys of the diffraction gratings 5 and 16, is less than the original thickness of guide layer 4 so that the etching does not reach into the active layer 3 underlying guide layer 4. In the manufacture of a distributed-feedback type semiconductor laser device embodying the present invention, for example, the Width $W_1$ of the stripe-shaped diffraction grating 5 constituting the distributed-feedback means may be from 2.0 to 5.0 $\mu$m, the Width $W_2$ of each of the plane regions 11 may be approximately 10.0 $\mu$m, and the Width $W_3$ of each of the inactive regions 16 may be approximately 270 $\mu$m.

Figure 8:
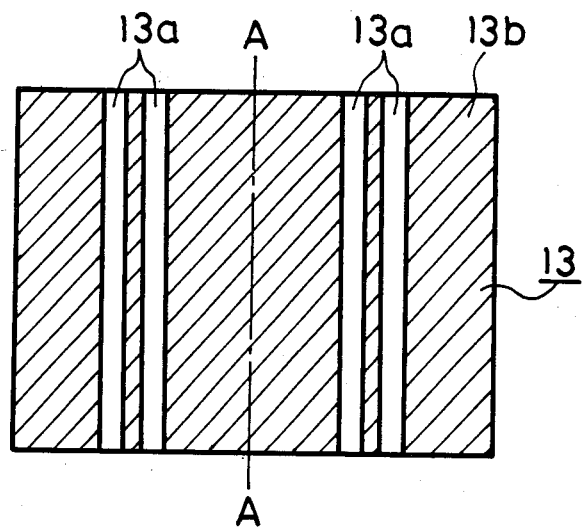
FIG. 8 is a plan view showing a photo-mask used in the step of the manufacturing method illustrated in FIG. 7B.

Following the etching operation, the resist-mask 14 is suitably removed and a clad layer 6 of n-type AlGaAs and a cap layer 7 of n-type GaAs are epitaxially grown, in succession, on the etched guide layer 4 formed with a refraction index wave guide mechanism and a distributed-feedback mechanism. Next, proton, boron or other like ions are implanted into cap layer 7 and the immediate underlying portion of clad layer 6 across the width of the semiconductor laser device with the exception of the central portion thereof corresponding to the width of diffraction grating 5 so as to form an ion implanted layer 8. Finally, ohmic electrodes 9 and 10 are formed on the free surfaces of substrate 1 and cap layer 7 to complete the distributed-feedback type semiconductor laser device 17 embodying the present invention as shown on FIGS. 4 and 5. As previously noted, the photo-mask 13 illustrated in FIG. 8 is intended for the simultaneous manufacture of two semiconductor laser devices. Thus, at the completion of the manufacturing operations described above, the resulting structure is divided or severed at a plane corresponding to the line A—A on FIG. 8 so as to obtain two identical semiconductor laser devices 17.

As described above, the inactive regions 16 formed at opposite sides of the stripe-shaped diffraction grating 5 and separated from the latter by the elongated plane regions 11 have the same configuration as the diffraction grating 5. In other words, the plane regions 11 are the only portions of the guide layer 4 in which the diffraction grating is not formed, and such plane regions 11 are narrow in comparison with the regions 5 and 16 having the diffraction grating.

By reason of the foregoing, the exposure, development and etching conditions for forming the stripe-shaped diffraction grating 5 can be substanially the same as the conditions employed for effecting such operations in the manufacturer of those semi-conductor laser devices according to the prior art having the diffraction grating extending over the entire surface of the guide layer. Thus, it is possible to control the conditions for forming the stripe-shaped diffraction grating in the same manner as such conditions are controlled when forming a diffraction grating over the entire area of the guide layer. As a result, the narrow stripe-shaped diffraction grating 5 of the semi-conductor laser device according to this invention can be formed with good reproducibility. Moreover, since the diffraction gratings constituting the inactive regions 16 do not serve any functional purpose in the completed distributed-feedback type semi-conductor laser device, the latter has the same operating characteristics as the semiconductor laser device according to the prior art, as illustrated in FIGS. 1–3, and in which the diffraction grating is formed only on a narrow stripe-shaped area of the guide layer. In other words, in accordance with the present invention, the narrow stripe-shaped diffraction grating 5 can be formed with a yield comparable to that obtained when the diffraction grating is formed over the entire area of the guide layer, but the semiconductor laser device formed in accordance with the invention has operating characteristics corresponding to those of the prior art semiconductor laser devices in which a diffraction grating was formed only on a narrow stripe-shaped area of the guide layer.

More specifically, in respect to the above mentioned operating characteristics of the semiconductor laser device embodying the invention, it is to be noted that a distributed-feedback mechanism is defined by the stripe-shaped diffraction grating 5 along the forwarding direction of the laser light and that a refraction index wave guide mechanism is defined by the rib structure 15 formed simultaneously with the defraction grating 5 on the guide layer 4, with the result that the obtained distributed-feedback type semiconductor laser device is operable in single longitudinal and transverse modes. Further, since plane regions are formed at opposite sides of the stripe-shaped diffraction grating 5 are coplanar with the valleys of the diffraction grating 5, the clad layer 6 and the cap layer 7 can be thereafter epitaxially grown with satisfactory crystallinity so that the useful life of the distributed-feedback type semiconductor laser device is substantially prolonged and the stability its operations is improved.

As earlier noted, the resist-mask 14 is formed on the guide layer 4 by development thereof following a double exposure, and the diffraction grating 5 and the rib structure 15 are simulanteously formed by a single etching process. By reason of such single etching process, the singularity or individuality of the transverse mode by refraction index wave guiding and of the longitudinal mode by distributed feedback are assured. Since the semiconductor laser device according to the present invention does not require excessive crystal growth or other manufacturing steps which can substantially influence the operational characteristics, such semiconductor laser device can be easily manufactured with desirable operational characteristics being obtained.

In the embodiment of the present invention described above with reference to FIGS. 4–6, the rib structure 15 is raised relative to the adjacent plane regions 11 as a result of the use of a positive type photo-resist layer 12. However, a negative type photo-resist layer may be used in which case the diffraction grating 5 will be depressed or recessed below the plane regions 11, that is, the plane regions 11 will be coplanar with the ridges of the saw-tooth configurations defining the diffraction grating.

Although the above described embodiment of the present invention has its various layers formed of GaAs and AlGaAs, it will be appreciated that the present invention can be similarly applied to distributed-feedback type semiconductor laser devices formed of other conventional materials suitable therefor.

By way of summary, it is noted that, in a distributed-feedback semiconductor laser device according to the invention, the distributed feedback means thereof is striped-shaped and has plane regions arranged at the opposite sides thereof so that single longitudinal and transverse modes of operation are available, the useful life of the device is prolonged and the stability of its operation is improved. Further, by providing inactive regions having the same configuration as the distributed-feedback means at relatively wide, non-functional regions outside the plane regions, it is possible to form the distributed feedback means in a narrow stripe-like region with good reproducibility, and without complicating the manufacturing process or adversely affecting the characteristics of the semiconductor laser device so that a relatively high yield of the latter is obtainable.

Having described a specific embodiment of the present invention with reference to the accompanying drawings, it is to be understood that the invention is not limited to that precise embodiment and that various modifications and variations can be effected therein by one skilled in the art without departing from the scope or spirit of the invention as defined in the appended claims.

What is claimed is:

1. A distributed-feedback type semi-conductor laser device operable in both single longitudinal and single transverse modes, comprising:
    a pair of clad layers;
    an active layer having a guide layer thereon, said active and guide layers being interposed between said pair of clad layers;
    said guide layer including stripe-shaped distributed-feedback means only along a relatively narrow central portion of said guide layer, inactive opposite side regions at opposite sides of said distributed-feedback means and having the same configuration as the distributed-feedback means, and elongated plane regions extending along opposite sides of said distributed-feedback means and dividing said inactive opposite side regions from said distributed-feedback means;
    a substrate underlying the one of said clad layers which is next to said active layer;
    first electrode means on a surface of the substrate layer which faces away from said one of the clad layers;
    a cap layer on a surface of the other of said clad layers facing in the direction away from said one clad layer;
    ion implanted regions in said cap layer which are coextensive with said inactive opposite side regions and said plane regions; and
    second electrode means on said cap layer.

2. A distributed-feedback type semiconductor laser device according to claim 1; in which said configuration of the distributed-feedback means and said inactive opposite side regions constitutes a diffraction grating.

3. A distributed-feedback type semiconductor laser device according to claim 2; in which said stripe-shaped distributed feedback means and said inactive opposite side regions are raised relative to said plane regions.

4. A distributed-feedback type semiconductor laser device according to claim 3, in which said diffraction grating is constituted by a saw-tooth configuration having ridges raised relative to said plane regions and valleys co-planer with said plane regions.

5. A distributed-feedback type semiconductor laser device according to claim 1, wherein said elongated plane regions are relatively narrow compared with said inactive opposite side regions.

6. A distributed-feedback type semiconductor laser device according to claim 1, wherein said elongated plane regions have substantially the same width which is at least approximately twice as large as a width of said distributed feedback means.

7. A distributed-feedback type semiconductor laser device according to claim 6, wherein said active layer is formed of gallium arsenide, the width of said distributed-feedback means is in the range 2.0–5.0 $\mu$m and the width of each of said plane regions is approximately 10.0 $\mu$m.

8. A distributed-feedback type semiconductor laser device according to claim 7, wherein a width of each of said inactive opposite side regions is approximately 270 $\mu$m.

9. A distributed-feedback type semiconductor laser device according to claim 4, wherein said elongated plane regions are relatively narrow compared to said inactive opposite side regions.

10. A distributed-feedback type semiconductor laser device according to claim 1, wherein said plane regions are coplanar with portions of said distributed-feedback means.

* * * * *